US010568455B2

(12) United States Patent
Buchholz et al.

(10) Patent No.: US 10,568,455 B2
(45) Date of Patent: Feb. 25, 2020

(54) METHOD AND DEVICE FOR PRODUCING MILK-AIR EMULSIONS

(71) Applicant: MELITTA PROFESSIONAL COFFEE SOLUTIONS GMBH & CO. KG, Minden (DE)

(72) Inventors: Bernd Buchholz, Rahden (DE); Thomas Diester, Bückeburg (DE)

(73) Assignee: MELITTA PROFESSIONAL COFFEE SOLUTIONS GMBH & CO. KG, Minden (DE)

( * ) Notice: Subject to any disclaimer, the term of this patent is extended or adjusted under 35 U.S.C. 154(b) by 366 days.

(21) Appl. No.: 15/621,978

(22) Filed: Jun. 13, 2017

(65) Prior Publication Data

US 2017/0367525 A1 Dec. 28, 2017

(30) Foreign Application Priority Data

Jun. 22, 2016 (DE) .................. 10 2016 111 423

(51) Int. Cl.
| | | |
|---|---|---|
| A47J 31/44 | (2006.01) | |
| A23C 9/00 | (2006.01) | |
| A23C 9/152 | (2006.01) | |
| A47J 31/10 | (2006.01) | |
| G01R 27/22 | (2006.01) | |

(52) U.S. Cl.
CPC ......... *A47J 31/4496* (2013.01); *A23C 9/1524* (2013.01); *A47J 31/4485* (2013.01); *A47J 31/4489* (2013.01); *A47J 31/106* (2013.01); *B01F 2215/0006* (2013.01); *G01R 27/22* (2013.01)

(58) Field of Classification Search
CPC .... A47J 31/4485; A23C 9/1524; B01F 15/06; B01F 2015/062; B01F 2215/0006

USPC ................. 99/452, 323.1; 426/519
See application file for complete search history.

(56) References Cited

U.S. PATENT DOCUMENTS

| | | | |
|---|---|---|---|
| 2011/0070349 A1* | 3/2011 | Burri .................. | A47J 31/4485 426/474 |
| 2013/0064941 A1* | 3/2013 | Taitler ................. | A47J 43/10 426/231 |
| 2014/0322415 A1 | 10/2014 | Buchholz et al. | |
| 2015/0305549 A1* | 10/2015 | Perentes ............ | A47J 31/4485 426/474 |
| 2018/0368611 A1* | 12/2018 | Savioz ................ | A47J 31/461 |

FOREIGN PATENT DOCUMENTS

| | | |
|---|---|---|
| CH | 705720 A2 | 5/2013 |
| DE | 102014105108 A1 | 10/2014 |
| DE | 102014112178 A1 | 3/2016 |
| DE | 102014119062 A1 | 6/2016 |
| EP | 2036472 A2 | 3/2009 |
| EP | 3181021 A1 | 6/2017 |

OTHER PUBLICATIONS

Search Report for European Patent Application No. 17177313 dated Nov. 10, 2017.

* cited by examiner

*Primary Examiner* — Reginald Alexander
(74) *Attorney, Agent, or Firm* — Fisherbroyles, LLP; Robert Kinberg

(57) ABSTRACT

A method for producing different types of milk-air emulsions with a milk-air emulsion generating device, comprising: producing the milk-air emulsions in dependence on at least one determined physical material characteristic of the milk-air emulsion.

18 Claims, 2 Drawing Sheets

METHOD AND DEVICE FOR PRODUCING MILK-AIR EMULSIONS

CROSS-REFERENCE TO RELATED APPLICATION

This application claims priority to German Application No. 10 2016 111 423.5, filed Jun. 22, 2016, the disclosure of which is incorporated herein by reference in its entirety

BACKGROUND OF THE INVENTION

The invention relates to a method and a device for producing milk-air emulsions, preferably different types of milk froth.

When producing milk-containing beverages with milk froth, different milk-froth qualities can noticeably influence the taste of the beverage and the optical appearance of the beverage. With respect to this, the applicant has already provided several improvements on a device for producing different types of milk froth.

German patent document DE 10 2014 105 108 A1, for example, discloses a homogenizer which optimizes the milk froth using impact bodies upon which the milk froth impinges.

German patent document DE 10 2014 119 062 A1 with a later publication date discloses a heating system for milk froth in which the milk froth can be heated to reach two different temperature ranges, thus making it possible to realize multiple milk-froth variations.

German patent document DE 10 2014 112 178 A1 discloses an air feeding system provided with a device for suctioning in air and a metering valve for the targeted release of air into the milk, with the goal of an automatic frothing of the milk.

SUMMARY OF THE INVENTION

An object of the invention is to provide a method for producing milk-air emulsions which permit a preferably continuous monitoring and correction of the quality and consistency of the milk-air emulsions.

The above and other objects are achieved according to one aspect of the invention by the provision of a method for producing milk-air emulsions, in particular different types of milk froth, which is realized with a device for producing such milk-air emulsions, wherein the method is controlled in dependence of at least one ascertained physical material characteristic. In this way, the consistency of the milk-air emulsion can easily and safely be monitored, adjusted and adapted according to specified values.

The method can advantageously be used for producing a milk-froth containing beverage, such as a coffee beverage. Hot beverages as well as cold beverages with milk froth can be realized with the method according to the invention.

According to another aspect of the invention, there is provided a milk emulsion generating device which in one embodiment, comprises: a milk line through which milk flows; at least one air-supply system coupled to the milk line for producing a milk-air emulsion; a processing device coupled in the milk line for heating the milk-air emulsion to a first temperature; at least a first measuring unit coupled in the milk line to determine a physical material characteristic of the milk-air emulsion; and a control and evaluation unit operative to adjust a control variable affecting the milk-air emulsion based on the determined physical material characteristic of the milk-air emulsion.

The milk line can extend from a milk container, a milk cooler or the like to a dispensing unit from which the milk froth is dispensed into or on top of the beverage.

The air supply system can operate based on a suction device, or a compressed-air line, e.g. belonging to an air cylinder, can be connected thereto. The term "air" in this case is not limited to the concrete composition of ambient air. The air can also refer to any gas that is not dangerous to food stuff, e.g. also to pure nitrogen or oxygen.

The milk or the milk-air emulsion can have a first temperature $T1$ and can be heated by the processing device to a warm temperature $T2$ and/or a hot temperature $T3$, wherein $T3>T2>T1$. The processing device can be designed for the direct or the indirect heating. According to one embodiment direct heating may be employed by introducing a gaseous heating medium which is non-toxic to food, in particular steam, for heating the milk froth to the hot temperature $T3$. For an indirect heating, e.g. through heat exchange with a heating medium or an electric heating element, a heating wire or the like is provided for heating the milk froth to a warm temperature $T2<T3$. The temperature $T3$ of the hot milk froth preferably ranges from 55° C. to 80° C. while the warm milk froth temperature $T2$ is a denaturizing temperature, in particular a temperature $T2$ ranging from 40° C. to 54° C.

The method according to the invention furthermore involves determining at least one physical material characteristic of the milk-air emulsion with the aid of at least one first measuring unit.

The first measuring unit can comprise one or several sensors. The measuring unit can measure values, e.g. in the form of a tension, from which a physical material characteristic can be derived.

The inventive method furthermore involves comparing an actual value to a desired value and/or a desired value range for the physical material characteristic and, insofar as the actual value is outside of the desired value, the adjustment of at least one variable in the process, to influence the physical material characteristic based on the desired specifications and/or corresponding to the desired value range.

A control and evaluation unit is advantageously used for the comparison and the adjustment.

The physical material characteristic advantageously can be the electrical conductivity of the milk-air emulsion. This material characteristic can be determined with conductivity sensors having comparatively low fluctuation tolerances. Based on inventive findings, the consistency of the emulsion can thus be determined and evaluated very easily since it is easy to measure as well as easy to influence the material characteristic.

With the aid of the detected physical material characteristic, the adjustment variable can be adjusted by controlling the pressure of the air supplied through the air-supply system. With an air intake system, which should also be understood to be an air supply system for the purpose of this invention, it can also mean controlling the negative air pressure.

Alternatively, or in addition, adjusting the variable can advantageously also involve controlling the flow of the milk or milk-air emulsion through the milk line, wherein this is advantageously achieved through controlling the flow of the milk or milk-air emulsion through a mixing chamber in which the milk-air emulsion if formed. This flow control can also involve a zero flow over a time interval, meaning the time during which the milk remains in the mixing chamber can be controlled. The longer the milk remains in the mixing chamber, the stronger it is frothed, even with a constant air pressure.

Adjusting the variable furthermore can advantageously or alternatively comprise a control of the heating-medium flow, in particular hot steam, or the capacity of an electric heating and/or warming unit in the processing machine. Thus, the temperature of the milk-air emulsion can also be adjusted based on the determined physical material characteristic.

The method can also advantageously comprise the following steps:

1. The pumping of milk through the milk line, for example with the aid of a milk pump. A milk pump of this type can have an optional design and can thus take the form of a suction pump.

2. The mixing of milk and air through feeding in (also suctioning in) of air through the system supplying air to the milk. The mixing of milk and air preferably occurs in a mixing chamber of the air supply system. In this way, it is possible to froth cold or prewarmed milk.

3. If applicable, the milk-air emulsion can then be preheated, advantageously to a temperature T2 or T3 of more than 40° C.

To be sure, the device according to the invention always contains a processing device with a heating unit, but this heating unit need not be connected for all types of milk froth productions. Rather, the milk or the milk froth can also be conducted without heating through the processing device, so that cold milk froth can also be dispensed. The terms heating unit and warming unit are used synonymously for this invention.

Thus, the heating through the heating medium can be optional. A heating is not absolutely required, but the cold milk froth can also be dispensed directly. However, the processing device can be used for warming up or heating up the milk froth.

The physical material characteristic is then advantageously determined with the first measuring unit and the control and evaluation unit. The determination can involve a direct measurement of the material characteristic or the measuring of data which are then converted via the control and evaluation unit into a representative value for the corresponding material characteristic.

A controlled adaptation of the milk froth temperature thus takes place in the processing device and/or a controlled frothing of the milk in the air supply system. With both adaptations, the material characteristic preferably changes, e.g. the conductivity, since the material characteristic advantageously depends on the temperature.

A control is advantageously effected by determining a real value for the material characteristic. This value is then compared by the control and evaluation unit to a stored desired value and/or desired value range for the material characteristic. If the real value exceeds or falls below the desired value and/or value range, one or several adjustment variables are adapted, which in the present case are the air pressure, the flow-through speed of the milk and/or the feeding of heating energy. This can be achieved through controlling one or several valves or by triggering one or more electrical components. The quality of the milk froth can thus be adjusted with respect to temperature and air/milk ratio. The latter ratio is determined by ascertaining a physical material characteristic, for example the density, the viscosity, the thermal, and/or especially preferred the electrical conductivity.

The control advantageously permits a continuous adaptation of the milk flow, the heating medium and/or the compressed air in dependence on the determined physical material characteristic of the milk-air emulsion during a continuous operation of the device according to the invention.

The first or second measuring unit for determining the electrical conductivity can furthermore be used to detect a lack of milk or a lack of cleaning fluid during an automatic cleaning of the device according to the invention.

Depending on the type of milk froth and the milk used (fat content, soy milk, animal milk, etc.), product-specific values can additionally be stored in the data memory of the control and evaluation unit, which can then be selected and called up by the control and evaluation unit, based on the user's selection of the type of milk and the selected beverage.

The device may comprise a first and a second measuring unit, wherein the first measuring unit is arranged between the air supply system for producing the milk-air emulsion and the processing device for heating the milk-air emulsion, and the second measuring unit is arranged downstream of the processing device, as seen in flow-through direction R of the milk and/or the milk-air emulsion. The physical material characteristic is determined prior to and following the heating of the milk-air emulsion. The first and the second measuring units may function to determine the physical material characteristic and advantageously also communicate with the control and evaluation unit. These units can involve two conductivity sensors for determining the electrical conductivity.

The device can furthermore comprise a temperature sensor, arranged upstream and/or downstream of the processing device as seen in flow-through direction R of the milk and/or milk-air emulsion, which sensor detects the temperature of the milk-air emulsion. The control and evaluation unit subsequently effects a temperature compensation of the determined physical material characteristic.

For a compact embodiment, the temperature sensor may form a component of the first and/or second measuring unit and/or can be designed to form a single structural unit with the conductivity sensor.

For heating up the milk-air emulsion, at least one processing line in which the heating medium is conducted, for example a hot liquid or steam, can furthermore be provided for the processing device, wherein this processing line comprises at least one control valve for controlling the flow of the heating medium in the processing line, wherein the control valve may be controlled by the control and evaluation unit in dependence on the temperature determined by the temperature sensor and/or in dependence on the determined physical material characteristic.

The time during which the milk-air emulsion remains in the heating unit can be adjusted in dependence on the determined physical material characteristic. For example, it is conceivable to blow air with a constant air pressure into the milk, but that the time during which the milk remains in the mixing chamber, for example, can be adjusted in dependence on the physical material characteristic. Of course, the dwell time of the milk in the mixing chamber of the air supply system can also be adjusted in addition to the air pressure.

A device according to the invention for producing a milk-air emulsion, in particular types of milk froth, may comprise a line through which milk flows and at least one air supply system for producing a milk-air emulsion. Furthermore, provided is a processing device for heating a milk-air emulsion and at least a first measuring unit for determining a physical material characteristic of the milk-air emulsion, as well as a control and evaluation unit for adjusting a control variable based on the physical material characteristic of the milk-air emulsion.

The measuring unit can include a single sensor of a measuring device or a combination of several sensors of a measuring device. The control and evaluation unit can be a transmitter of the measuring unit. A physical material characteristic can be a density, a viscosity, a thermal, and/or an electrical conductivity.

The control and evaluation unit is designed for the setting of an adjustment variable in dependence on the determined physical material characteristic.

With the device according to the invention, it is also possible to adjust the air supply in dependence on the material characteristic of the milk froth.

The device may comprise a unit for adjusting the control variable, the unit including a metering valve, preferably an adjustable metering valve, which forms a component of the air supply system and controls the air supplied by this system. A needle valve, for example an automatically adjustable needle valve, may be used for the adjustable metering valve.

The temperature of the milk-air emulsion can be taken into consideration for determining the physical material characteristic, for example by determining the temperature with a temperature sensor and by compensating the temperature of the detected physical material characteristics to reach a standard temperature value, e.g. 25° C. A better comparison is thus possible between the desired value and the actual value. Alternatively, different temperature values can also be stored for the desired value, so that with the detected temperature, a comparison is possible between the actual value and the desired value for the physical material characteristic of the milk froth at the location and at the point in time when the measurement is taken.

The air supply system can comprise a line for suctioning air into the air supply system.

By using an adjustable control valve in this air-supply line as adjustment unit, together with the option of controlling the various heating units, the supplied amount of air can be adjusted in dependence on a physical material characteristic, especially in dependence on the conductivity and the temperature of the produced milk-air mixture.

The control and evaluation unit may be provided with a microcontroller and/or a data memory, wherein the latter is used to store data sets for desired values and/or desired value ranges in dependence on the temperature and/or a desired milk-containing beverage and/or a type of milk used.

It is also conceivable that the control and evaluation unit determines a non-constant profile that can change for desired values and/or desired value ranges and then the profile used to effect a control of the process.

The evaluation unit can consider the type of froth, as well as the respective production process, among other things with the desired consistency for the end-product, the milk temperature, the type of milk and/or the conditions for setting up the machine. These factors can be considered within the framework of a calibration and/or an adjustment through data sets with respect to the desired value ranges. Different types of milk froth furthermore also require supplying a different amount of air which must be taken into consideration with corresponding datasets.

These adjustments which must be tested manually, for example, can subsequently be realized automatically by the device according to the invention.

On the whole, it is possible to reach a self-adjustment for the device according to the invention.

The flow-through of the milk and/or milk-air emulsion can be adjusted by adjusting the milk pumping capacity.

The electrical conductivity of the milk-air emulsion is a preferred physical material characteristic to be determined since it is quite suitable for determining and evaluating the consistency of the emulsion based on a finding according to the invention, wherein this variable is particularly easy to measure and easy to influence.

For the present invention, the method and/or device according to the invention can be used in a machine for dispensing, in particular also for preparing, a milk-containing beverage and especially a milk-containing coffee beverage. A corresponding device is preferably embodied as fully automatic coffee machine.

BRIEF DESCRIPTION OF THE DRAWINGS

In the following, the invention is described in further detail with reference to the drawing by using an exemplary embodiment.

DETAILED DESCRIPTION OF THE INVENTION

The terms milk-air mixture and milk-air emulsion and milk froth are used synonymously herein.

Figure 1:
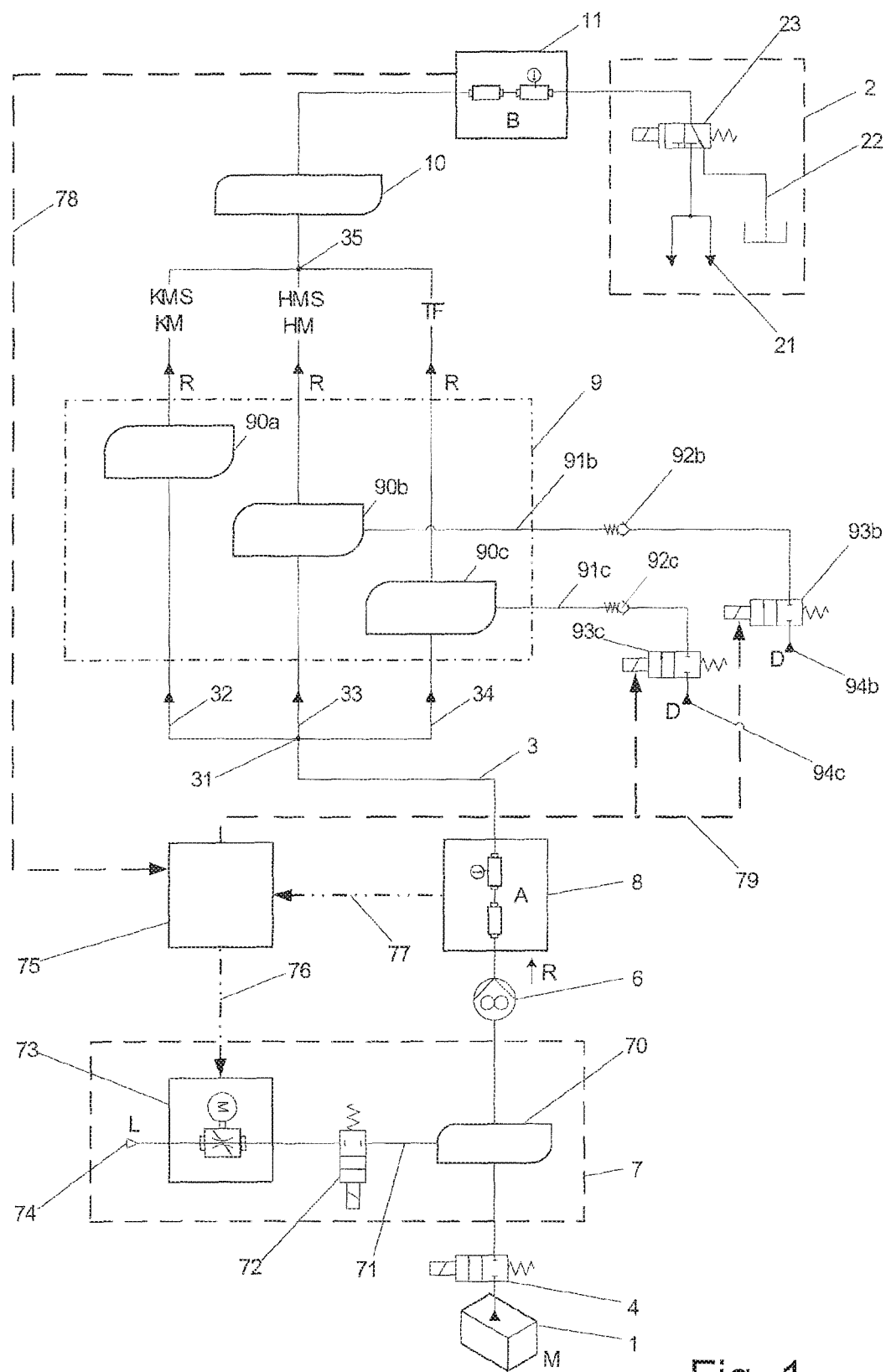
FIG. 1 is a schematic representation of the configuration of a device according to the invention for producing milk-air emulsions, especially milk froth.

Referring to FIG. 1, there is shown a milk line 3 connected between a milk container 1 with milk M and a dispensing device 2. The dispensing device 2 is embodied as a spout below which a vessel such as a cup can be positioned. The terms dispensing device 2 and spout are used synonymously in the following.

The following components are inserted in the following sequence into the milk line 3, between the milk container 1 and the dispensing device 2: a shut-off valve 4, a milk pump 6, an air supply system 7, a first measuring unit 8, a processing device 9, as well as a post-processing device 10 and a second measuring unit 11.

The air supply system 7 is provided with an air line 71 and, if applicable, a mixing chamber 70. The milk flows via the milk line 3 into this mixing chamber 70. The frothing is achieved by blowing in air. The air supply can be connected to an air source 74 (e.g. an air pump or a compressed-air container or a container not under pressure or via an opening and/or a line end (for suctioning in) to the ambient air inside a surrounding machine or outside thereof).

A first back-pressure valve (also known as a check valve) 72 is installed between the mixing chamber 70 and the air source 74. In addition, an adjustment unit 73 is arranged along the air line, between the first back-pressure valve 72 and the air source 74, which allows adjusting the pressure with which the air is blown via the air line 71 into the milk.

At least a portion of the milk is frothed in this way, resulting in forming a milk-air emulsion.

The adjustment unit 73 receives a control command from a control and evaluation unit 75 which is transmitted via a signal line 76 to the adjustment unit 73. The signal line 76 can be, for example, a cable or a wireless connection.

The first measuring unit 8 measures/determines measuring data for determining the physical material characteristic.

This material characteristic changes with the quality of the milk froth, in particular the ratio of air to milk per cubic centimeter of milk froth.

A physical material characteristic of this type may be the electrical conductivity. The value for the electrical conductivity correlates to the share of the air in the milk froth. Besides the electrical conductivity, however, the thermal conductivity, the density and/or the viscosity can also be determined. For this, the first measuring unit 8 is preferably provided with a conductivity sensor. The first measuring unit is furthermore advantageously provided with a temperature sensor for compensating the determined conductivity. The temperature of the milk and/or the milk-air emulsion can also be adapted to a desired value by regulating the amount of cold air that is supplied.

The first measuring unit 8 is connected via a signal line 77, e.g. a cable or a wireless connection, to the control and evaluation unit 75 and transmits the measured values to this control and evaluation unit 75. Based on the measured data, this unit can determine the respective material characteristic as a first actual value and can then compare this value to a specified desired value of a desired value range.

Should the value exceed or fall below the desired value, the amount of air which is introduced into the milk can be changed by the adjustment unit 73, such that a second actual value falls within the permitted desired range. Depending on the hot beverage that is selected, several desired values can also be stored in a data memory of the control and evaluation unit 75 for the respective desired value range, either as a single data set or several data sets. The control and evaluation unit 75 may be a central a central computer unit which is operative for comparing, for example, the desired values with the actual values, specifically for the respective hot beverage.

The processing device 9 comprises partial sections of the milk line 3, including processing lines 32, 33 and 34. One or several switching valves can be provided for this, for example two-way or three-way valves 31 and 35, which can be switched in such a way that the milk can flow through one of the processing lines 32, 33 or 34. A first processing line 32 is a through line and does not contain a heating unit (indicated nevertheless by a reference: 90*a*). This line allows the flow of cold milk froth.

A second processing line 33 is provided with a first heating unit 90*b* which functions to directly heat up milk. The first heating unit 90*b* comprises a heating line 91*b* by means of which steam D can be introduced with the aid of a steam-producing unit 94*b* directly into the emulsion, wherein a control valve 93*b* is provided for this. A back-pressure valve 92*b* is arranged between the control valve 93*b* and the point where the steam D is introduced into the milk.

Alternatively, or in addition to the first heating unit 90*b* for directly heating up the milk, a third processing line 34 is provided with a second heating unit 90*c* for the indirect heating up of milk.

This second heating unit 90*c* can be a heat transfer unit, for example, in particular a heat exchanger.

Assigned to the second heating unit 90*c* can be a heating line 91*c* through which steam can flow into the heating device 90*c* for the indirect heating, starting from the steam generating unit 94*c*. For this, a control valve 93*c* is provided and can be actuated for opening and closing the steam supply line for the steam D. A back-pressure valve 92*c* is arranged between the control valve 93*c* and the point at which the heat in the form of steam D is introduced into the milk, in particular with the aid of a heat exchanger.

A warm milk froth (here also called "TF"=top foam) is a special type of milk froth or foam which presupposes an indirect heating of the cold milk froth as a result of the defined requirements for consistency, stability, thermo-reception and optic. (Characteristics which are not changed by the direct introduction of another medium, e.g. the direct injection of steam D.) The temperature of the cold milk froth (KMS) preferably is <30° C., that of the warm milk froth (TF-T2) is 40° to 54° C. and that of the hot milk froth (HMS) is 55° to 80° C. The hot milk froth (HMS-T3) and the hot milk can be heated up extremely quickly to high heat via a direct steam injection. (High dispensing capacity at high temperature (55-80° C.)).

The processing device 9 is advantageously designed to heat a milk-air emulsion flowing through and/or the cold milk froth with the temperature T1 to a temperature T2 which is higher than the temperature T1 of the cold milk froth KMS and is below the temperature T3 for the hot milk froth HMS. The "warm" milk froth TF (temperature T2) is generated in this way.

The first, second and third processing lines 32, 33, 34 can advantageously be embodied as decompression lines. The first processing line 32 here is used for generating a cold milk froth with the cold temperature T1; the second processing line 33 with the first heating unit 90*b* serves the direct heating and can be used for generating a hot milk froth with the high temperature T3; and the third processing line 34 with the heating unit 90*c* can serve to generate a warm milk froth with the median temperature T2, wherein the following applies: T1<T2<T3. The processing lines 32, 33, 34 are switched parallel in this case.

Of course, it is also possible to combine individual processing lines, in particular the processing lines 33 and 34, into a single processing line with the option for heating, especially for introducing steam. All three processing lines 32-34 can also be combined in this way into a single line.

Hot, warm and cold milk can be dispensed with direct heating, indirect heating or no heating at all, depending on the use of hot steam. According to one variant, two types of milk froth having different temperatures are dispensed into a ready coffee, or the two types of milk froth with different temperatures are first made available and the coffee is then added.

In this way, a combined hot/cold processing line 32/33 can also be created and/or provided and a separate warm-processing line 34 with indirect heating of the milk froth. In that case, warm milk froth TF flows exclusively through the processing line 34 and cold or hot milk froth KMS, HMS or hot milk HM or cold milk KM without froth flow through the combined processing line 32/33.

The heating unit 90*b* is based on a heating through direct introduction of steam. The heating unit 90*c* can be embodied as indirect heat transmitter operated with steam or optionally as a fluid-operated indirect heat transmitter which, once it is activated, indirectly heats the milk-air emulsion to a temperature T2. The temperature T2 preferably is between 40° and 54° C.

The indirectly acting heating unit 90*c* can be embodied in different ways, e.g. as a shell and tube heat exchanger, as a layer heat exchanger or as a spiral tube heat exchanger. The heat is transferred after the cold milk froth is generated and before it is dispensed. It is advantageous if the warm froth TF with temperature T2, as well as the cold milk froth KMS with temperature T1 and the hot milk froth HMS with temperature T3, are subjected to a post-treatment in a post-treatment device, especially a homogenizer 10.

The amount of heat introduced by the indirectly acting heating unit 90c is preferably transferred to the milk froth via one or several contact heating surfaces. In this function and to increase the contact surface and thus the heat transfer, an additional inside or outside heating channel is also conceivable, as well as a temperature query on the inside of the element with a sensor. Water vapor/steam may serve as the heat carrier.

The consistency of the still cold milk froth KMS with temperature T1, which flows out of the pump 6, can be changed by adjusting the amount pumped by the milk pump 6, in particular the milk pump speed. However, this can directly influence the pumping capacity and the dispensing amount. The amount of air may be changed by changing the metering valve 72, which may be embodied as an automatically adjustable needle valve.

In one embodiment, all tube sections can be flushed with cold water, for which corresponding feed lines and valves can be provided (not shown herein).

The post-processing device 10, which may be a homogenizer, is arranged in the milk line 3, downstream of the processing device 9.

With known fully automatic coffee machines, the consistency of the milk froth, above all the forming of air bubbles, is frequently very irregular. The generated milk froth can be homogenized with the aid of the homogenizer. According to one embodiment, a homogenizer may be created for the post-processing of the milk froth which is designed to reduce the bubbles in a milk froth, within the meaning of a milk-air emulsion or a milk-air mixture. A milk-air mixture of this type comprises a defined amount of milk to which a defined amount of air is supplied. Optionally, a milk-air mixture of this type also contains a defined amount of (hot) steam (water). The consistency of a milk froth can be optimized with the homogenizer. In particular, by varying the pressure at the intake, the consistency of the milk froth can be changed from fine, meaning having very small air bubbles, to rough with very large air bubbles, and from loose, to creamy, to solid. The homogenizer is advantageously used in an automatic hot-beverage maker, especially a fully automatic coffee machine. The homogenizer may include a reducing region in which a plurality of impact bodies are arranged. A channel labyrinth extends between the impact bodies through which the milk-air mixture flows. The milk-air mixture can be pushed in partial flows through the channel labyrinth. For this, several impact bodies are may be arranged side-by-side in a row. The individual impact bodies may have an impact surface with which the partial flows of the milk froth come in contact when flowing through the channel labyrinth. During the impact, the partial flows are divided and the air bubbles divide, thus resulting in smaller air bubbles. In an embodiment, the homogenizer may contain several rows of impact bodies, arranged one below the other in a longitudinal direction which is the flow direction of the milk. Thus, the partial flows impact with the respective impact bodies of the rows arranged in flow direction one below the other, so that the air bubbles are reduced multiple times.

A second measuring unit 11 is arranged downstream of the post-processing device. This second measuring unit 11 may contain a sensor for determining the aforementioned physical material characteristic, in particular a conductivity sensor, and/or a sensor for determining the milk temperature.

Most physical material characteristics are temperature-dependent material characteristics. For example, the electrical conductivity is dependent on the temperature. For preparing hot beverages it may be useful to determine whether the specified temperature for the hot beverage has been reached, and/or whether a determined actual value for the hot beverage lies within the specified desired range. Corresponding desired values can be stored specifically for the respective hot beverage as a data set in the data memory of the control and evaluation unit 75.

The second measuring unit is correspondingly connected via a signal line 78 to the control and evaluation unit 75 and can be embodied as a cable or a wireless connection. Measuring data for determining the physical material characteristic are thus detected via the second measuring unit 11, and/or actual temperatures are detected as measuring data for the milk or the milk froth with this second measuring unit. These measuring data are then transmitted via the signal line 78 to the control and evaluation unit 75.

For the case where the measuring data or the material characteristics and/or temperatures determined therewith are outside of a predetermined desired value range, the control and evaluation unit 75 generates a control command 79 for controlling one or several of the control valves 93b, 93c of the first or second heating line 90b and/or 90c. Alternatively, or additionally and not shown herein, the control and evaluation unit 75 can also control one or both switchover valves 31, 35. As a result, the milk temperature in particular can be adjusted to a specified temperature value within the desired value range, and the milk froth quality can be checked at this target temperature by determining the conductivity and can be adjusted correspondingly through a subsequent control.

The above-described air supply system 7 preferably functions to supply air in accordance with a method using the following steps:

a) Pumping of milk through a milk line with the aid of a milk pump and simultaneously suctioning in air through an air line, wherein at least one metering valve is used to change the suctioned-in amount of air;

b) Mixing of milk and air in a first mixing chamber for generating an air-milk emulsion;

c) If applicable, adding steam to the milk-air emulsion to heat up the milk-air emulsion (preferably according to step b) if a warm milk froth is to be generated; and d) Wherein a metering valve is used in step a) which is embodied such that the opening adjusts continuously variable, in particular with the aid of an electric motor (M), and wherein the air line is preferably closed by closing the opening cross section with the adjustable metering valve.

The metering valve in this case should be understood as a design variant of a control unit 73.

The opening cross section of the metering valve can be adjusted according to the invention based on the conductivity and/or the desired milk froth temperature.

The metering valve used in step a) can be embodied adjustable with respect to the size of the opening cross section. The continuous adjustment of the valve opening cross section makes it possible to adjust the amount of air supplied to the milk in dependence on the desired milk-air mixture. In this way, milk-air mixtures, in particular types of milk froth having different characteristics, can be produced with only one adjustable metering valve. The opening cross section of the metering valve is preferably smaller when producing the warm milk-air mixture than for producing the cold milk-air mixture. The consistency of the milk-air mixture can furthermore be varied for the most part independent of the temperature by varying the opening cross section.

A metering valve embodied continuously adjustable with respect to the opening cross section, in particular with the aid of an electric motor, is called in the following an adjustable metering valve.

An electric motor is preferably used for adjusting the opening cross section of the adjustable metering valve. A quasi continuous adjustment, for example made possible with a stepping motor, is also possible with an adjustable metering valve of the type as can be provided for the adjustment unit 73.

Alternatively, or in addition to controlling the supplied amount of air, the control and evaluation unit 75 can also advantageously be used to control the amount conveyed and pumped by the milk pump 6 in dependence on the physical material characteristic, especially the conductivity. The consistency of the milk froth can be changed in this way as well.

By using an adjustable metering valve as adjustment unit in combination with the option of controlling the various heating units, the amount of air that is supplied can be adjusted in dependence on a physical material characteristic, especially in dependence on the conductivity and the temperature of the produced milk-air mixture.

The dispensing device 2 can comprise a valve 23, dispensing nozzles 21, and a lance 22 for dispensing hot water and/or hot steam, e.g. for a manual frothing.

Figure 2:
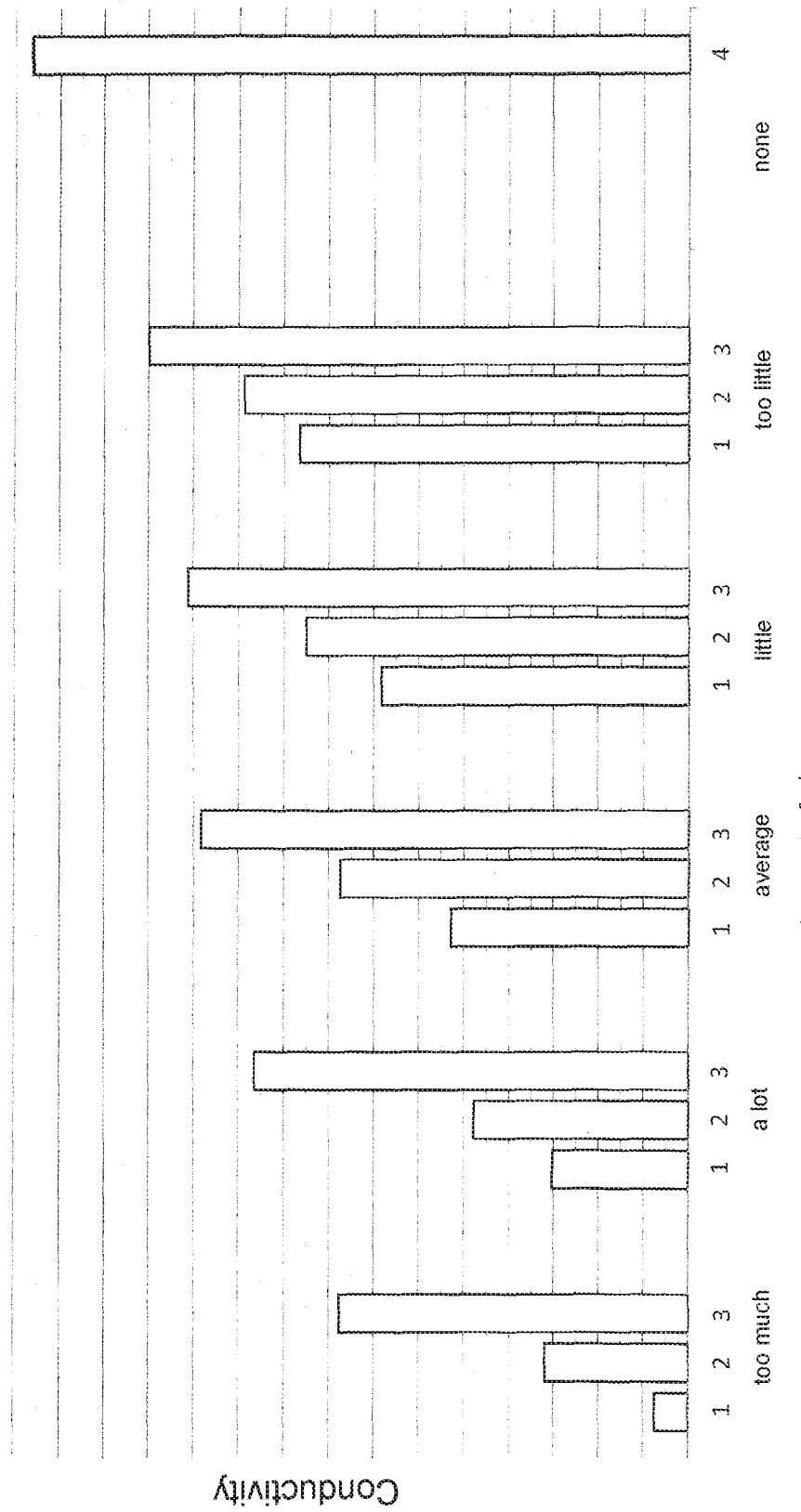
FIG. 2 is a diagram of the electrical conductivity of types of milk froth at various temperatures and with different amounts of introduced air.

FIG. 2 schematically shows an example of the dependence between the electrical conductivity and the amount of air in the milk (type of milk: cow's milk; 1.5% fat; ultra-high temperature milk) with a starting temperature of 3-5° C. The number 1 here refers to a milk froth at approximately 3-5° C. The number 2 refers to a warm milk froth at approximately 45° C., while the number three refers to a hot milk froth at 65° C. Obvious is a dependence of the conductivity on the temperature of the milk froth and the amount of air. By adjusting the variables for air pressure, temperature and time interval for the frothing, the froth quality can be influenced. The quality of the froth can be determined based on the electrical conductivity.

The electrical conductivity of milk froth can be utilized with the device according to FIG. 1 in order to evaluate this milk froth and to influence it via the supplied amount of air. The conductivity of the milk froth, in particular, depends on the type of milk, the milk temperature and the amount of air. Given the respective measurement and knowledge of the conductivity characteristic of the various types of milk and the temperatures, which can be considered among other things with desired value datasets, an optimum milk-to-air ratio can be defined for the further processing and can be created, for example, via the automatic control of the air supply. Thus, the amounts of air can be controlled individually and dynamically. The control can automatically adapt to the internal and external parameters, which basically permits a reaction to the changes in the operating conditions and strongly simplifies the calibration and adjustment of the system. Changes in the milk temperature can be compensated to a limited degree through the supply of air.

The above-described measuring units which are used comprise a conductivity sensor and a temperature sensor.

In one embodiment, the first measuring unit 8 is arranged directly on the pressure side of the milk pump 6.

Alternatively, or additionally, the second measuring unit 11 (or an additional measuring unit) can be arranged behind the post-processing device 10, as shown in FIG. 1.

For example, it is possible to measure the raw-milk temperature and to warn of quality losses. Alternatively, or additionally, it is possible to adjust hot milk or hot milk froth in dependence on the temperature.

The aforementioned control can be effected with a self-adjusting system at the installation location. A service technician can check the adjusted beverage products, and based on the client's wish, can make adjustments when setting desired value datasets, so that the desired products can be dispensed to the end user.

It will be understood that the above description of the present invention is susceptible to various modifications, changes and adaptations, and that the same are intended to be comprehended within the meaning and range of equivalents of the appended claims.

What is claimed is:

1. A device for producing different types of milk-air emulsions, comprising:
   a milk line through which milk flows;
   at least one air-supply system coupled to the milk line for producing a milk-air emulsion;
   a processing device coupled in the milk line for heating the milk-air emulsion to a first temperature;
   at least a first measuring unit coupled in the milk line to determine a physical material characteristic of the milk-air emulsion;
   a control and evaluation unit operative to adjust a control variable affecting the milk-air emulsion based on the determined physical material characteristic of the milk-air emulsion;
   a milk pump having a pressure side and being arranged in the milk line, wherein the first measuring unit is arranged in the milk line directly on the pressure side of the milk pump; and
   a second measuring unit arranged on the pressure side of the milk pump downstream of the processing device, wherein at least one of the first measuring unit and the second measuring unit are operative for optimizing the distribution of air in a milk-air emulsion.

2. The device according to claim 1, wherein the at least one air supply comprises a unit, including an adjustable metering valve, coupled to an output of the control and evaluation unit to control the pressure of the air supplied by the air-supply system.

3. The device according to claim 1, wherein the first measuring unit includes a temperature sensor to detect the temperature of the milk-air emulsion which is used for determining the physical material characteristic.

4. The device according to claim 1, wherein the air-supply system comprises an air source for suctioning air into a line of the air-supply system.

5. The device according to claim 1, further comprising a post-processing device arranged in the milk line downstream of the processing device, and the second measuring unit is arranged downstream of the post-processing device.

6. The device according to claim 1, wherein the control and evaluation unit comprises a data store including at least one of datasets of desired values and datasets of desired value ranges that are a function of at least one of temperature, a desired milk-containing beverage and a supplied type of milk.

7. The device according to claim 6, wherein the control and evaluation unit is operative to determine a non-constant profile of at least one of the desired values and desired value ranges to subsequently realize a control parameter.

8. A method of dispending a milk-froth containing hot coffee or chocolate beverage, comprising utilizing the device according to claim 1.

9. A method for producing different types of milk-air emulsions with a milk-air emulsion generating device which includes: a milk line through which milk and/or milk-air emulsion flows between a milk container and a dispensing device; at least one air supply system for generating a milk-air emulsion coupled in the milk line; and at least one processing device, having at least one heating device for heating the milk-air emulsion, coupled in the milk line downstream of the at least one air supply system for further processing of the milk-air emulsion, the method comprising:

determining a physical material characteristic of the milk-air emulsion with at least a first measuring unit;

comparing an actual value and a desired value range for the physical material characteristic;

adjusting an adjustment variable to influence the physical material characteristic when the actual value is outside of a desired value range to produce an adjusted actual value for the physical material characteristic, wherein the adjusting the adjustment variable includes controlling the pressure of the air supplied through the air-supply system; and producing the milk-air emulsion in dependence on the actual value of the determined physical material characteristic of the milk-air emulsion or on the adjusted actual value when the actual value is outside of the desired value range.

10. The method according to claim 9, wherein the step of determining the physical material characteristic includes determining the electrical conductivity of the milk-air emulsion.

11. The method according to claim 9, wherein the adjusting the adjustment variable additionally includes controlling the flow of the milk or milk-air emulsion through the milk line.

12. The method according to claim 9, wherein the air supply system includes a mixing chamber in which the milk-air emulsion is generated, and the adjusting the adjustment variable includes controlling the flow of the milk or milk-air emulsion through the mixing chamber.

13. The method according to claim 9, wherein the adjusting of the adjustment variable includes adjusting the heating device of the processing device.

14. The method according to claim 9, wherein the milk-air emulsion generating device includes: a temperature sensor arranged in the milk line upstream of the processing device to detect a temperature of the milk-air emulsion; and a control and evaluation unit arranged to receive the temperature detected by the temperature sensor; wherein the method further comprises effecting a temperature compensation of the detected physical material characteristic with the control and evaluation unit based on the detected temperature.

15. The method according to claim 14, wherein the temperature sensor is a component of the first measuring unit.

16. The method according to claim 9, wherein the processing device includes at least one heating line containing a heating medium for heating the milk-air emulsion, and the heating line comprises at least one control valve for controlling the flow of the heating medium in the heating line; and the method further comprises controlling the at least one control valve in dependence on at least one of a detected temperature of the milk-air emulsion and the determined physical material characteristic.

17. A method for producing different types of milk-air emulsions with a milk-air emulsion generating device which includes a milk line through which milk and/or milk-air emulsion flows between a milk container and a dispensing device; at least one air supply system for generating a milk-air emulsion coupled in the milk line; and at least one processing device, having at least one heating device for heating the milk-air emulsion, coupled in the milk line downstream of the at least one air supply system for further processing of the milk-air emulsion, the method comprising:

determining a physical material characteristic of the milk-air emulsion with a first measuring unit coupled in the milk line between the air-supply system and the processing device and with a second measuring unit coupled in the milk line downstream of the processing device, wherein the determining comprises determining the physical material characteristic before and after the heating of the milk-air emulsion with the first and second measuring units, respectively;

comparing an actual value and a desired value range for the physical material characteristic;

adjusting an adjustment variable to influence the physical material characteristic when the actual value is outside of a desired value range to produce an adjusted actual value for the physical material characteristic; and producing the milk-air emulsion in dependence on the actual value of the determined physical material characteristic of the milk-air emulsion or on the adjusted actual value when the actual value is outside of the desired value range.

18. A method for producing different types of milk-air emulsions with a milk-air emulsion generating device which includes a milk line through which milk and/or milk-air emulsion flows between a milk container and a dispensing device; at least one air supply system for generating a milk-air emulsion coupled in the milk line; and at least one processing device, having at least one heating device for heating the milk-air emulsion, coupled in the milk line downstream of the at least one air supply system for further processing of the milk-air emulsion, the method comprising:

determining a physical material characteristic of the milk-air emulsion with at least a first measuring unit;

comparing an actual value and a desired value range for the physical material characteristic;

adjusting an adjustment variable to influence the physical material characteristic when the actual value is outside of a desired value range to produce an adjusted actual value for the physical material characteristic;

producing the milk-air emulsions in dependence on the actual value of the determined physical material characteristic of the milk-air emulsion or the adjusted actual value when the actual value is outside of the desired value range; and adjusting a time interval during which the milk-air emulsion remains in the processing device in dependence on the determined physical material characteristic.

* * * * *